United States Patent
Yamaguchi et al.

(10) Patent No.: US 9,236,503 B2
(45) Date of Patent: Jan. 12, 2016

(54) SOLAR CELL

(75) Inventors: Hiroshi Yamaguchi, Osaka (JP); Kazuyo Nakamura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/880,804

(22) PCT Filed: Oct. 17, 2011

(86) PCT No.: PCT/JP2011/073805
§ 371 (c)(1),
(2), (4) Date: Apr. 22, 2013

(87) PCT Pub. No.: WO2012/053471
PCT Pub. Date: Apr. 26, 2012

(65) Prior Publication Data
US 2013/0206228 A1  Aug. 15, 2013

(30) Foreign Application Priority Data

Oct. 22, 2010  (JP) .................... 2010-236991

(51) Int. Cl.
| | |
|---|---|
| *H01L 31/00* | (2006.01) |
| *H01L 31/02* | (2006.01) |
| *H01L 31/0224* | (2006.01) |
| *H01L 31/048* | (2014.01) |
| *H01L 31/05* | (2014.01) |
| *H01L 31/044* | (2014.01) |

(52) U.S. Cl.
CPC .. *H01L 31/02013* (2013.01); *H01L 31/022433* (2013.01); *H01L 31/044* (2014.12); *H01L 31/048* (2013.01); *H01L 31/0504* (2013.01); *Y02E 10/50* (2013.01)

(58) Field of Classification Search
CPC ............... H01L 31/02013; H01L 31/022433
See application file for complete search history.

(56) References Cited

U.S. PATENT DOCUMENTS

| 6,225,793 | B1 * | 5/2001 | Dickmann | .............. 323/230 |
| 6,316,832 | B1 | 11/2001 | Tsuzuki et al. | |
| 6,563,289 | B1 * | 5/2003 | Cross | .............. 320/101 |
| 2004/0255999 | A1 * | 12/2004 | Matsushita et al. | .......... 136/244 |

(Continued)

FOREIGN PATENT DOCUMENTS

| EP | 0 984 495 A2 | 3/2000 |
| JP | 9-82865 | 3/1997 |

(Continued)

OTHER PUBLICATIONS

International Search Report for PCT/JP2011/073805, mailed Nov. 22, 2011.

*Primary Examiner* — Eli Mekhlin
(74) *Attorney, Agent, or Firm* — Nixon & Vanderhye, P.C.

(57) ABSTRACT

A connection part for connecting an interconnector is separated from a region having a photoelectric conversion layer formed thereon to improve a strength of the connection pad, thereby provide a solar cell suppressing cracks, breaks, and the like. A solar cell includes a photoelectric conversion layer, an electrode pad formed on the photoelectric conversion layer, an interconnector connected to the electrode pad, a metal thin film formed under the photoelectric conversion layer, a relay terminal being spaced apart from the photoelectric conversion layer and the metal thin film and connected to the metal thin film by connection conductor, and a connection pad formed on the relay terminal.

4 Claims, 5 Drawing Sheets

(56) References Cited

U.S. PATENT DOCUMENTS

| | | | |
|---|---|---|---|
| 2008/0023069 A1 * | 1/2008 | Terada et al. | 136/256 |
| 2008/0041437 A1 | 2/2008 | Yamaguchi | |

FOREIGN PATENT DOCUMENTS

| | | |
|---|---|---|
| JP | 11-150286 | 6/1999 |
| JP | 2004-200515 | 7/2004 |
| JP | 2005-129773 | 5/2005 |
| JP | 2005129773 A * | 5/2005 |
| JP | 2006-156663 | 6/2006 |
| JP | 2008-28366 | 2/2008 |
| JP | 2010-040591 | 2/2010 |
| WO | WO 99/62125 | 12/1999 |
| WO | WO 2010057978 A1 * | 5/2010 |

* cited by examiner

SOLAR CELL

This application is the U.S. national phase of International Application No. PCT/JP2011/073805, filed 17 Oct. 2011, which designated the U.S. and claims priority to JP Application No. 2010-236991, filed 22 Oct. 2010, the entire contents of each of which are hereby incorporated by reference.

TECHNICAL FIELD

The present invention relates to a solar cell, and particularly to a structure of a connection part for connecting an interconnector to a solar cell.

BACKGROUND ART

A silicon crystal-based solar cell employing a silicon substrate and having a pn junction formed on the silicon substrate is currently on the mainstream. As a solar cell capable of achieving a higher photoelectric conversion efficiency than the silicon crystal-based solar cell, there is a solar cell employing a compound semiconductor of a direct-transition type having a greater optical-absorption coefficient. Many of compound semiconductor solar batteries employing a compound semiconductor currently under development is of a multi-junction structure having a plurality of photoelectric conversion layers with a pn junction and each photoelectric conversion layer having different band gap from one another. Therefore, since a sunlight spectrum can be utilized effectively, a higher photoelectric conversion efficiency than the compound semiconductor solar cell having one photoelectric conversion layer can be obtained. Particularly, a solar cell used for an artificial satellite or the like requires a high photoelectric conversion efficiency and reduction in weight. In light of the above, forming a compound semiconductor solar cell having a multi-junction structure on a resin film is considered.

FIG. 10 represents a solar cell string disclosed in WO99/62125 (PTD 1) formed by electrically connecting solar batteries employing a compound semiconductor. Solar batteries 152, 158 have corresponding integral bypass diodes 154, 160 respectively to form a solar cell string by means of an interconnector.

A first interconnector 164 connects a front contact 155 formed on a cascade cell 156 having a plurality of photoelectric conversion layers in solar cell 152 and a front contact 159 in solar cell 158, so that solar cell 152 and solar cell 158 are electrically connected. Second interconnector 165 connects front contact 155 of solar cell 152 and a back contact 163 of solar cell 158, so that solar cell 152 and solar cell 158 are electrically connected. The numerals 153 and 161 indicate front contacts. The numeral 157 indicates a back contact. The numeral 162 indicates a cascade cell having a plurality of photoelectric conversion layers.

CITATION LIST

Patent Document

PTD 1: WO99/62125

SUMMARY OF INVENTION

Technical Problem

In a solar cell employing a compound semiconductor, for reduction of weight and cost, development has been made in epitaxially growing a photoelectric conversion layer on a semiconductor substrate and thereafter separating the semiconductor substrate and the epitaxially grown photoelectric conversion layer to obtain a thin film formation. In production of the solar cell string shown in WO 99/62125 (Patent Document 1), a solar cell is arranged on a base plate with the side having the front contact formed thereon facing downward, and an interconnector is welded and connected to a back contact. However, since the photoelectric conversion layer is formed to be a thin film, cracks, breaks and the like has occurred in the solar cell due to unevenness on a surface formed by the front contact.

The present invention was made in view of circumstances described above, and its object is to improve a strength at a connection part of connecting the interconnector in a solar cell.

Solution to Problem

A solar cell of the present invention includes: a photoelectric conversion layer; an electrode pad formed on the photoelectric conversion layer; an interconnector connected to the electrode pad; a metal thin film formed under the photoelectric conversion layer; a relay terminal being spaced apart from the photoelectric conversion layer and the metal thin film and connected to the metal thin film by a connection conductor; and a connection pad formed on the relay terminal.

In the solar cell of the present invention, the relay terminal is preferably fixed by resin on glass formed on a light receiving surface side.

Further, in the solar cell of the present invention, the photoelectric conversion layer, the interconnector, the electrode pad, and the metal thin film are preferably fixed by resin on the glass.

Further, in the solar cell of the present invention, preferably, a plurality of relay terminals are formed, and at least one is formed by metal material.

Further, in the solar cell of the present invention, preferably, a plurality of relay terminals are formed, and at least one is a bypass diode.

Further, in the solar cell of the present invention, the connection pad is preferably formed on a surface opposite to the surface side of the relay terminal with the glass formed thereon.

Further, in the solar cell of the present invention, the photoelectric conversion layer is preferably formed by an epitaxial growth.

Advantageous Effects of Invention

According to the present invention, in a solar cell, a relay terminal is provided at a part constituting a connection part of an interconnector, and the relay terminal and a photoelectric conversion layer are spaced apart so that cracks, breaks and the like which may possibly occur in the solar cell can be suppressed by improving the strength of the connection part of the interconnector.

DESCRIPTION OF EMBODIMENTS

Figure 1:
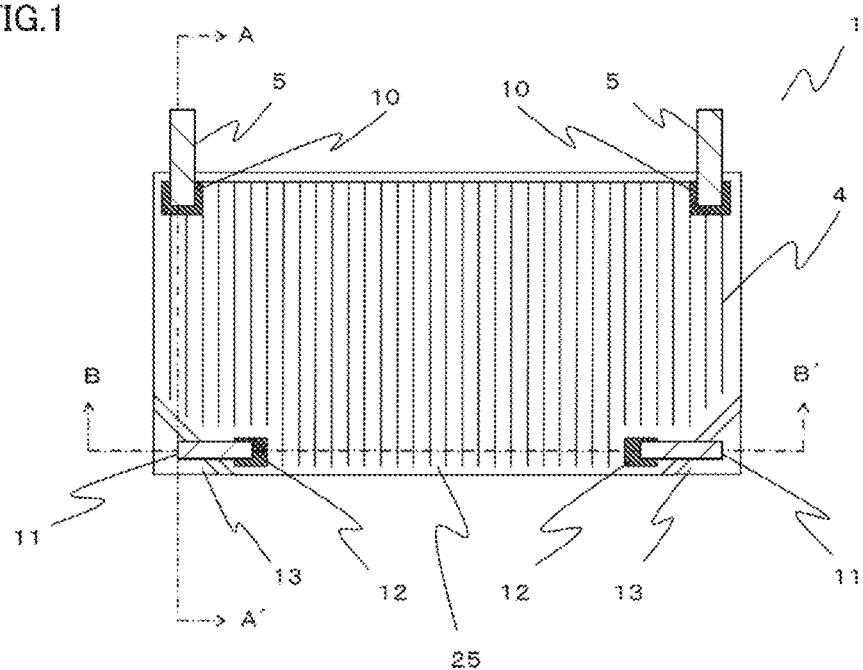
FIG. 1 represents a schematic view of a light incident side according to an example of the solar cell of the present invention.

Hereinafter, embodiments of the present invention will be described with reference to the drawings. In the drawings below, the same or corresponding parts have the same reference numerals allotted, and description of those will not be repeated.

First Embodiment

FIG. 1 represents an example of a solar cell of the present invention viewed over a glass of a sunlight incident-side.

A solar cell 1 has n-type electrode pads 10 and p-type electrode pads 12 formed thereon. A comb-shaped n-type electrode 4 and interconnectors 5 are connected to n-type electrode pads 10. On the other hand, p-type electrode pads 12 are connected to relay terminals 13 through metal ribbons 11. The reference numeral 25 indicates a solar cell main body. The interconnectors electrically connect solar cells during formation of a solar cell string and are formed of metal material. Further, the metal ribbons as connection conductors electrically connect the relay terminals and the solar cell main body and are formed of metal material.

A cross-sectional structure of solar cell 1 will be described with reference to FIGS. 2 and 3.

Figure 2:
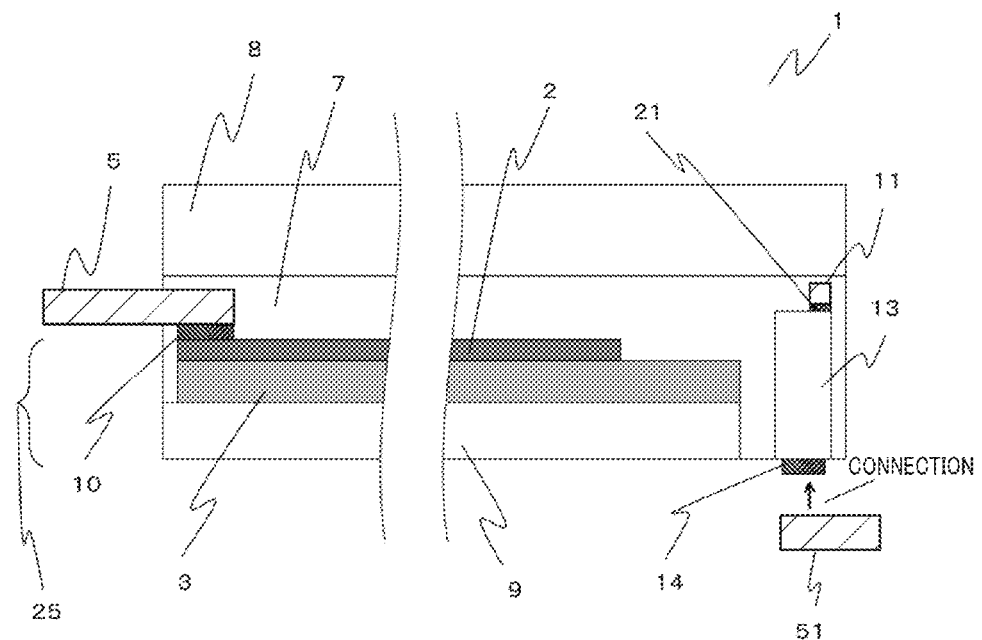
FIG. 2 is a cross-sectional view schematically representing a configuration of a cross section taken along the A-A' line shown in FIG. 1.

FIG. 2 represents a cross section taken along the A-A' line of FIG. 1 passing through n-type electrode pads 10 and relay terminals 13. A photoelectric conversion layer 2 is formed on a semiconductor substrate by the epitaxial growth and thereafter separated from the semiconductor substrate to constitute a compound semiconductor layer. Photoelectric conversion layer 2 has at least one pn junction, and a light incident side thereof is of an n-type semiconductor layer, and a back side opposite to the light incident side is of a p-type semiconductor layer. N-type electrode 4 (not shown in the cross section of FIG. 2) and n-type electrode pads 10 are formed on the light incident side of photoelectric conversion layer 2, and a metal thin film 3 is formed on a back side. Metal thin film 3 is formed by vapor deposition as p-type extraction electrode of photoelectric conversion layer 2. Further, under metal thin film 3, a resin film 9 serving as a base material is formed. Herein, the region on resin film 9 is assumed to be a solar cell main body 25.

Interconnectors 5 are electrically connected to n-type electrode pads 10 in advance by parallel-gap welding or the like.

Interconnector 5 is connected to the connection pad of adjacent solar cell to form a solar cell string. In this case, shortening the length of the interconnector can shorten a distance between the solar cells, thereby forming a compact solar cell string. Since the number of connection points during formation of the solar cell string can be made smaller, a process ability of a production line can be enhanced.

Solar cell 1 is provided with relay terminals 13 separated apart from solar cell main body 25, and relay terminals 13 are formed of metal material. Relay terminals 13 serve as connection terminals on p-type side, and electrically connected to p-type electrode pad 12 through electrode pad 21 by metal ribbons 11. Herein, metal ribbons 11 may be connected directly to relay terminals 13. Forming relay terminals 13 as connection terminals of p-type side other than solar cell main body can enhance a strength of connection parts during connection of interconnector. Further, metal material is employed in the first embodiment to improve a strength of relay terminals 13. Further, separation causes a force applied during interconnector connection with respect to solar cell main body to be less likely to occur, so that solar cell string can be produced while suppressing cracks, breaks, and the like which may occur in solar cell main body 25.

Solar cell main body 25 and relay terminals 13 are sealed with resin 7, and covered and fixed by single glass 8 as separate elements. Relay terminals 13 are fixed on glass 8 to have a higher strength at connection parts. Concurrently, the part of interconnector 5 welded to n-type electrode pad 10 is sealed with resin and fixed on glass 8, so that a strength is high. The reference numeral 51 indicates an interconnector of an adjacent solar cell.

An electrode pad 14 for connecting the interconnector is formed on a side opposite to the side of glass 8 of relay terminals 13. The connection of interconnector is conducted by placing glass 8 surface of solar cell 1 on a base plate. Since no unevenness affecting the connection is provided on the surface of glass 8, cracks, breaks, and the like which may occur in solar cell main body 25 during connection can be suppressed.

Figure 3:
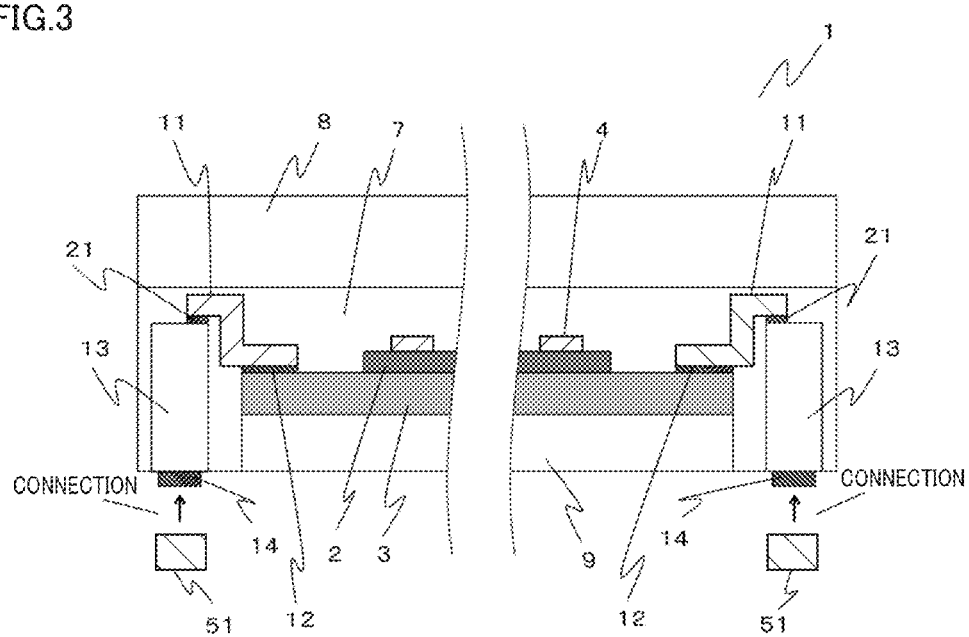
FIG. 3 is a cross-sectional view schematically representing a configuration of a cross section taken along the B-B' line shown in FIG. 1.

FIG. 3 represents a cross section taken along the B-B' line shown in FIG. 1, at which relay terminals 13 appear on both sides. P-type electrode pads 12 are formed on metal thin film 3, and connected to relay terminals 13 with metal ribbons 11. A plurality of relay terminals 13 are preferably formed on solar cell 1 in view of reliability.

Connections between solar cell main body 25 and relay terminals 13 by metal ribbons 11 is conducted before fixing glass 8 by resin sealing. Among the connections, connection of metal ribbons 11 on the side of solar cell main body 25 is conducted by placing solar cell main body 25 on a base plate. In this stage, since there is no unevenness affecting the connection on the back side of resin film 9, cracks, breaks, and the like which may occur in solar cell main body 25 during connection can be suppressed. Further, connecting interconnector 5 to solar cell main body 25 is similarly conducted by placing a base plate on solar cell main body 25 before fixing on glass. Therefore, on back side of resin film 9, no unevenness affecting the connection is present, so that cracks, breaks, or the like which may occur in solar cell main body 25 during connection can be suppressed.

Second Embodiment

Figure 4:
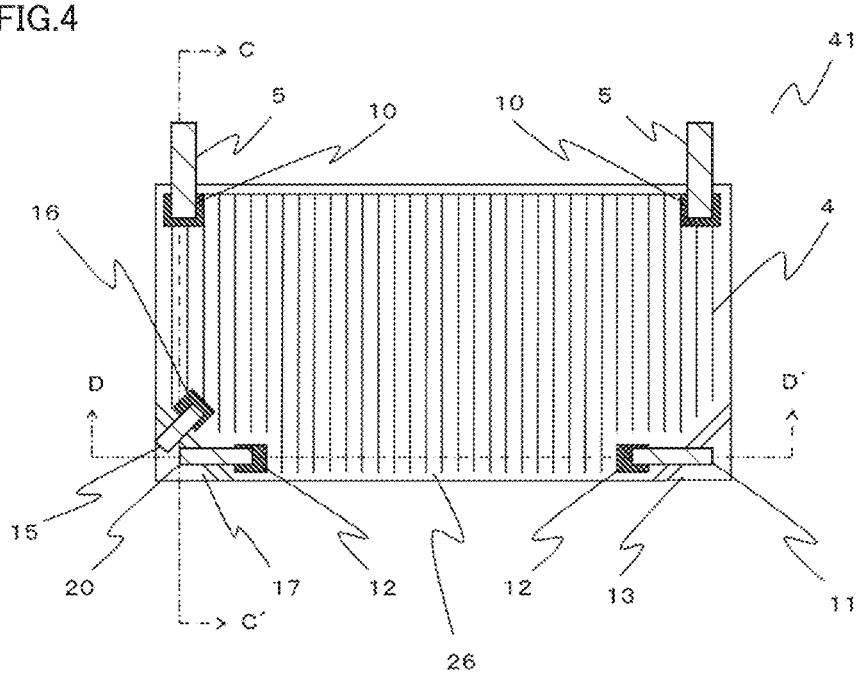
FIG. 4 is a schematic view from a light incident side according to another example of the solar cell according to the present invention.

FIG. 4 represents another example of solar cell of the present invention viewed over glass from a sunlight incident side.

A solar cell 41 and solar cell 1 of the first embodiment are different in that one of the relay terminals is a bypass diode 17, and other structure is the same as solar cell 1. A p-region of bypass diode 17 is connected to an n-type electrode pad 16 through a metal ribbon 15, and an n-region of bypass diode 17 is connected to p-type electrode pads 12 through metal ribbons 20. The reference numeral 26 indicates a solar cell main body.

Figure 5:
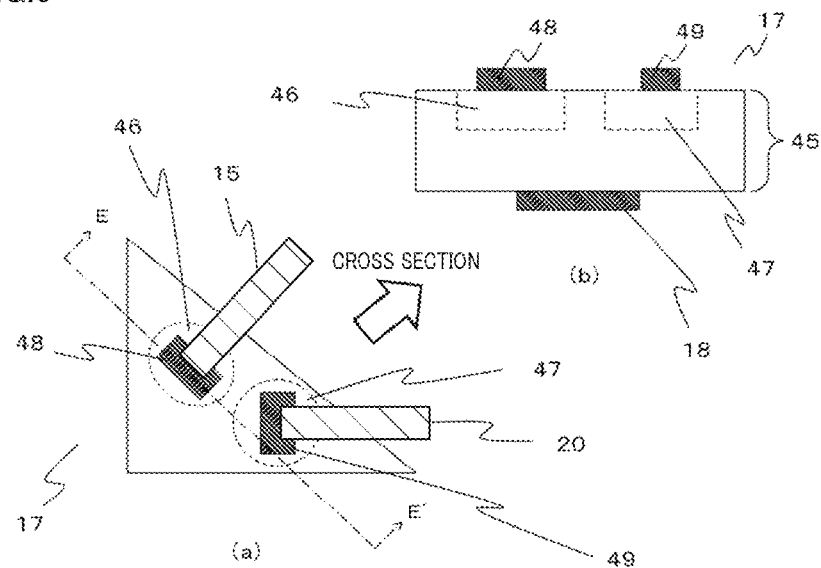
FIG. 5 is a schematic view representing the bypass diode shown in FIG. 4.

FIG. 5 is a view enlarging bypass diode 17 of FIG. 4, and (a) is a top view, and (b) is a view representing a cross section taken along the E-E' line of (a). A p-region 46 and an $n^+$ region 47 are formed on an n-type semiconductor substrate 45 of bypass diode 17. An n-type impurity concentration of $n^+$ region 47 is higher than an n-type impurity concentration of n-type semiconductor substrate 45. An electrode pad 48 formed on p-region 46 is electrically connected to n-type electrode pad 16 by metal ribbon 15, and electrode pad 49 formed on $n^+$ region 47 is electrically connected to p-type electrode pad 12 by a metal ribbon 20. A connection pad 18 is formed on a back side of bypass diode 17. Bypass diode 17 serves also as a relay terminal of a connection terminal for p-type side. All of relay terminals may be a bypass diode having a connection pad.

Figure 6:
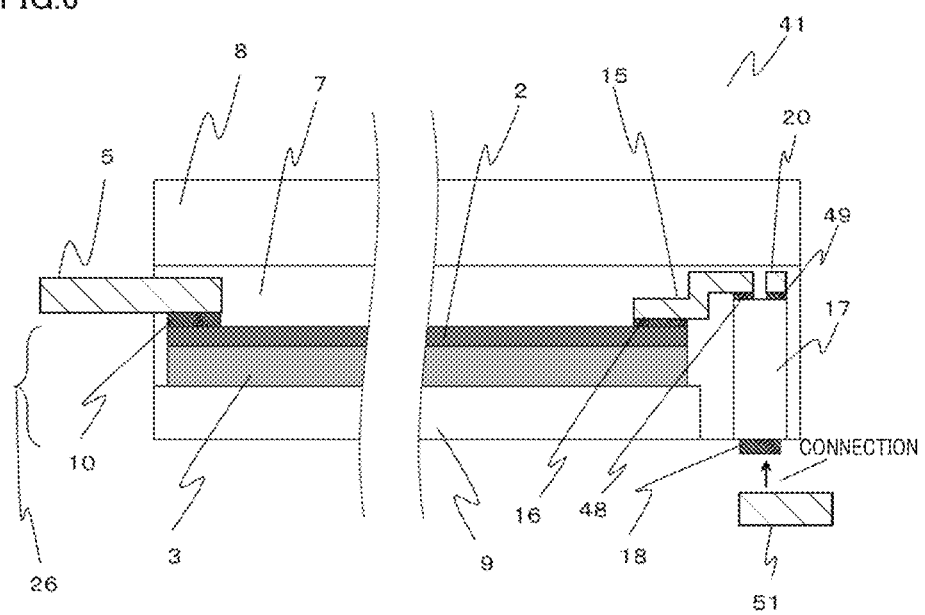
FIG. 6 is a cross-sectional view schematically representing a configuration of a cross section taken along the C-C' line shown in FIG. 4.

FIG. 6 represents a cross section taken along the C-C' line passing through n-type electrode pad 10 and bypass diode 17. N-type electrode pad 16 is formed on a light incident side of photoelectric conversion layer 2. Bypass diode 17 and solar cell main body 26 are, as separate elements, sealed with resin 7, and covered and fixed by single glass 8. Bypass diode 17 is fixed on glass 8 so that a strength becomes higher as connection part. Reference numeral 51 indicates an interconnector of adjacent solar cell.

Figure 7:
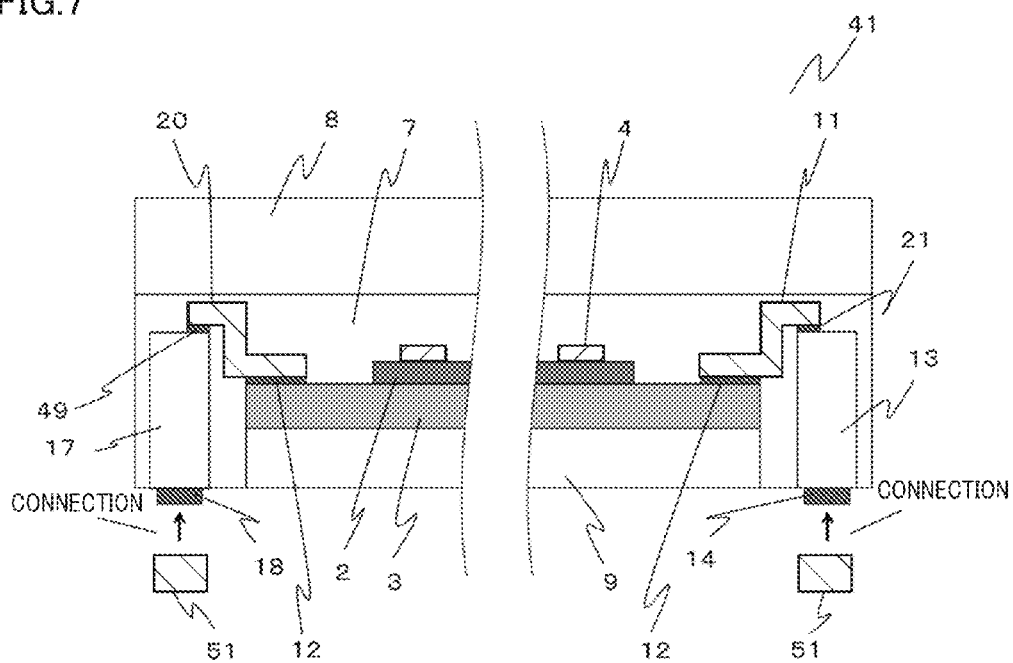
FIG. 7 is a cross-sectional view schematically representing a configuration of a cross section taken along the D-D' line shown in FIG. 4.

FIG. 7 represents a cross section taken along the D-D' shown in FIG. 4 at which bypass diode 17 and relay terminal appear. Since bypass diode 17 employs semiconductor material, a strength of connection pad can be made higher, so that when connecting interconnector to bypass diode 17, cracks, breaks, and the like which may occur in solar cell main body 26 can be suppressed.

On bypass diode 17, connection pad 18 as one of p-type side connection pad of solar cell 41 is formed, and bypass diode 17 is sealed with resin and fixed on glass 8. The interconnector connection is conducted by placing the surface of glass 8 of solar cell 41 on a base plate. On the surface of glass 8, there is no unevenness affecting the connection, so that cracks, breaks, or the like which may occur in solar cell main body 26 during connection can be suppressed.

Further, integrating bypass diode 17 and solar cell 41 can reduce the number of connection points, so that a process ability of a production line can be enhanced.

Figure 8:
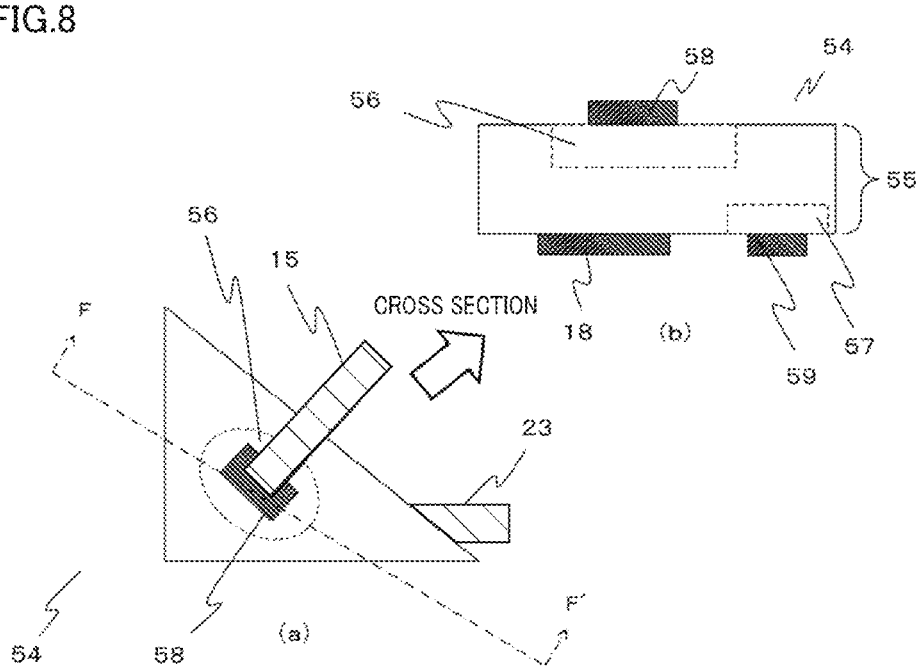
FIG. 8 is a schematic view of another example representing a bypass diode of the present invention.

FIG. 8 represents another example of bypass diode. The drawing (a) is a top view, and (b) represents a cross section taken along the F-F' line shown in (a). The solar cell employing bypass diode 54 shown in FIG. 8 is substantially the same as solar cell 41 except for the structure of solar cell 41 shown in FIG. 4 having a structure of bypass diode 54 in place of bypass diode 17.

Bypass diode 54 has n-type semiconductor substrate 55 with a p-region 56 and an $n^+$ region 57 formed therein. Electrode pad 58 formed on p-region 56 is electrically connected to n-type electrode pad 16 by metal ribbon 15, and electrode pad 59 formed on $n^+$ region 57 is electrically connected to p-type electrode pad 12 by metal ribbon 23. Connection pad 18 is formed on a back side of bypass diode 54. Bypass diode 54 serves also as a relay terminal of a connection terminal on the p-type side. All of the relay terminals may be bypass diode having a connection pad.

Third Embodiment

Figure 9:
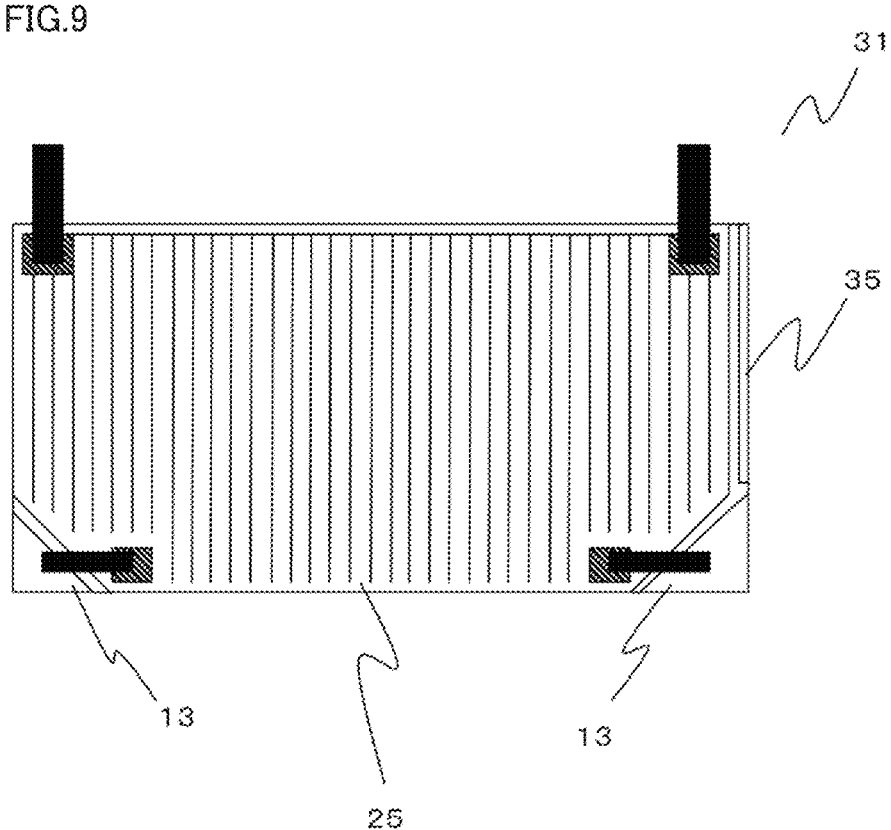
FIG. 9 is a schematic view from a light incident side of yet another example of the solar cell according to the present invention.
Figure 10:
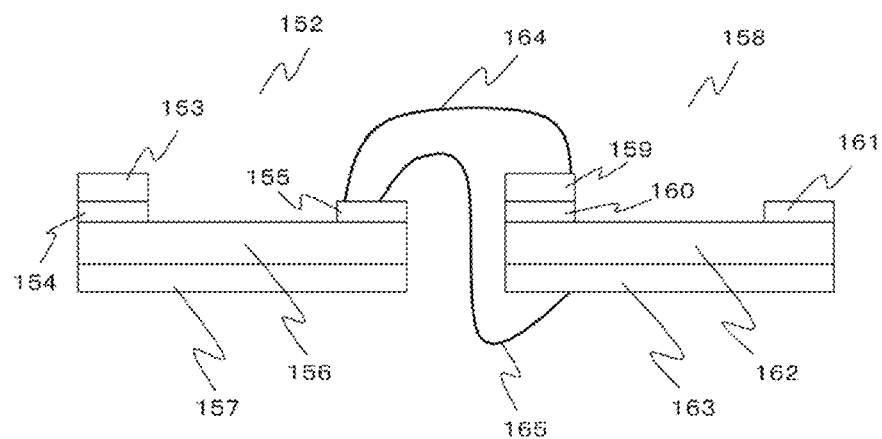
FIG. 10 is a schematic view of one example of a solar cell string of the conventional art.

FIG. 9 shows yet another example of solar cell of the present invention over glass from a sunlight incident side.

A solar cell 31 is different from solar cell 1 of the first embodiment in that bypass diode 35 is formed, and other structure is substantially the same as solar cell 1. Bypass diode 35, solar cell main body 25, and relay terminal 13 are, as separate element, integrally covered with glass 8 and sealed with resin. Bypass diode 35, solar cell main body 25, and relay terminal 13 are fixed on glass respectively. Wire connection of bypass diode 35 is not shown in FIG. 9, but bypass diode 35 is connected electrically by conductive material with photoelectric conversion layer formed on solar cell main body 25. Further, the arrangement, size, and shape of bypass diode 35 shown in FIG. 9 are one example.

According to the third embodiment, the number of connection points can be reduced by integrating bypass diode 35 and solar cell 31, so that the process ability of production line can be enhanced.

As shown in Embodiments 1-3, when a solar cell string is formed by forming solar cell main body and relay terminals separately, effect of pulling by interconnector of connection portion of the p-side as solar cell string to solar cell main body can be suppressed.

REFERENCE SIGNS LIST 1 solar cell; 2 photoelectric conversion layer; 3 metal thin film; 4 n-type electrode; 5 interconnector; 7 resin; 8 glass; 9 resin film; 10 n-type electrode pad; 11 metal ribbon; 12 p-type electrode pad; 13 relay terminal; 14 connection pad; 15 metal ribbon; 16 n-type electrode pad; 17 bypass diode; 18 connection pad; 19 electrode pad; 20 metal ribbon; 21 electrode pad; 23 metal ribbon; 25 solar cell main body; 26 solar cell main body; 31 solar cell; 35 bypass diode; 41 solar cell; 45 n-type semiconductor substrate; 46 p-region; 47 $n^+$ region; 48 electrode pad; 49 electrode pad; 51 interconnector; 54 bypass diode; 55 n-type semiconductor substrate; 56 p-region; 57 $n^+$ region; 58 electrode pad; 59 electrode pad; 152 solar cell; 153 front contact; 154 integral bypass diode; 155 front contact; 156 cascade cell; 157 back contact; 158 solar cell; 159 front contact; 160 integral bypass diode; 161 front contact; 162 cascade cell; 163 back contact; 164 first interconnector; 165 second interconnector.

The invention claimed is:

1. A solar cell string comprising a plurality of electrically connected solar cells, each solar cell comprising:
   a photoelectric conversion layer;
   an electrode pad disposed on said photoelectric conversion layer;
   an interconnector connected to said electrode pad;
   a metal thin film disposed under said photoelectric conversion layer;
   a plurality of relay terminals;
   at least one relay terminal of the plurality of relay terminals of each said solar cell being spaced apart from said photoelectric conversion layer and said metal thin film, said at least one relay terminal including a first electrical pad, a second electrical pad and a connection pad, said at least one relay terminal being connected to said metal thin film by a connection conductor connected to the second electrical pad; and
   said connection pad disposed on said relay terminal and connecting an interconnector of an adjacent solar cell to said relay terminal, wherein said relay terminal, said photoelectric conversion layer, said interconnector, said electrode pad, and said metal thin film are integrally fixed by resin on one coverglass, said connection pad is disposed on a surface of said relay terminal opposite to said coverglass, said electrode pad is disposed on a surface of said photoelectric conversion layer facing the coverglass, wherein said first and second electrical pads being formed on regions of the at least one relay terminal having different conductivity types and function as a bypass diode, and the second electrical pad and the connection pad are formed on portions of the at least one relay terminal having the same conductivity type and function as a relay.

2. The solar cell string according to claim 1, wherein said plurality of relay terminals include the at least one relay terminal and another relay terminal formed of metal material.

3. A solar cell string according to claim 1, wherein said photoelectric conversion layer is formed by an epitaxial growth.

4. A solar cell, comprising:
a photoelectric conversion layer;
a surface electrode disposed on a surface of the photoelectric conversion layer;
an electrode pad disposed on said photoelectric conversion layer;
an interconnector connected to said electrode pad;
a metal thin film disposed under said photoelectric conversion layer;
at least one relay terminal of said solar cell being spaced apart from said photoelectric conversion layer and said metal thin film, said relay terminal having first and second electrode pads disposed on said relay terminal, the first electrode pad being connected to the metal thin film, and the second electrode pad being connected to the surface electrode, the first and second electrode pads being formed on portions of the at least one relay terminal of different conductivity types; and a connection pad being formed on a portion of the at least one relay terminal of the same conductivity type as the portion on which the second electrode pad is formed and being disposed on said relay terminal, said connection pad being configured to connect an interconnector of an adjacent solar cell to said relay terminal, wherein said at least one relay terminal, said photoelectric conversion layer, said interconnector, said electrode pad, and said metal thin film are integrally fixed by resin on one coverglass, said connection pad is disposed on a surface of said relay terminal opposite to said coverglass, said electrode pad is disposed on a surface of said photoelectric conversion layer facing the coverglass, and wherein the solar cell comprises a plurality of relay terminals, and the at least one relay terminal comprises a bypass diode formed by the first and second electrode pads and a relay formed by the second electrode pad and the connection pad.

* * * * *